(12) United States Patent
Aoki et al.

(10) Patent No.: US 8,114,307 B2
(45) Date of Patent: Feb. 14, 2012

(54) PIEZOELECTRIC BODY AND LIQUID DISCHARGE HEAD

(75) Inventors: Katsumi Aoki, Yokohama (JP); Kenichi Takeda, Yokohama (JP); Tetsuro Fukui, Yokohama (JP); Hiroshi Funakubo, Yokohama (JP); Shintaro Yasui, Yokohama (JP); Ken Nishida, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 123 days.

(21) Appl. No.: 11/849,871

(22) Filed: Sep. 4, 2007

(65) Prior Publication Data

US 2008/0089832 A1    Apr. 17, 2008

(30) Foreign Application Priority Data

Sep. 15, 2006  (JP) ................ 2006-250602
Mar. 20, 2007  (JP) ................ 2007-072401

(51) Int. Cl.
*C04B 35/495* (2006.01)
*C04B 35/00* (2006.01)
*C01G 51/04* (2006.01)
*C01G 29/00* (2006.01)
*H01L 41/00* (2006.01)
*B41J 2/045* (2006.01)

(52) U.S. Cl. ......... 252/62.9 R; 252/62.9 PZ; 423/594.5; 423/594.7; 310/311; 347/68

(58) Field of Classification Search ............. 423/594.5, 423/594.7; 347/68; 310/311; 252/62.9 R, 252/62.9 PZ
See application file for complete search history.

(56) References Cited

U.S. PATENT DOCUMENTS

| 5,663,032 A | 9/1997 | Fukui et al. |
| 6,783,588 B2 | 8/2004 | Aoto et al. |
| 7,042,141 B2 | 5/2006 | Funakubo et al. ............ 310/357 |
| 7,216,962 B2 | 5/2007 | Miyazawa et al. ............ 347/68 |
| 2002/0179000 A1* | 12/2002 | Lee et al. .................. 117/4 |
| 2004/0231581 A1 | 11/2004 | Aoto et al. |
| 2005/0018019 A1* | 1/2005 | Miyazawa et al. ............ 347/68 |
| 2007/0060467 A1 | 3/2007 | Matsuda et al. ............. 501/134 |
| 2007/0215715 A1 | 9/2007 | Fukui et al. ................ 239/102.2 |
| 2008/0067898 A1 | 3/2008 | Aoki et al. |

FOREIGN PATENT DOCUMENTS

| JP | 6-350154 | 12/1994 |
| JP | 2005-39166 | 2/2005 |
| JP | 2005-47748 | 2/2005 |

OTHER PUBLICATIONS

X. P. Jiang, H. L. W. Chan, R. E. Newnham. (Properties of PbTiO3—(Bi1/2Na1/2)(In1/2Nb1/2)O3 piezoelectric ceramics with high Curie temperature), Mater. Lett. 57 (2003), 3667-3670.*

(Continued)

*Primary Examiner* — Jerry Lorengo
*Assistant Examiner* — Carlos Barcena
(74) *Attorney, Agent, or Firm* — Fitzpatrick, Cella, Harper & Scinto

(57) ABSTRACT

The present invention provides a piezoelectric element and having a piezoelectric body and a pair of electrodes being contact with the piezoelectric body, wherein the piezoelectric body consists of an ABO$_3$ perovskite oxide in which an A-site atom consists of Bi and a B-site atom is composed of an atom of at least two types of elements.

10 Claims, 3 Drawing Sheets

OTHER PUBLICATIONS

T. Shishidou, N. Mikamo, Y. Uratani, F. Ishii, T. Oguchi, First-principles study on the electronic structure of bismuth transition-metal oxides, J. Phys.: Condens. Matter. 16 (2004), S5677-S5683.*

Y. Uratani, T. Shishidou, F. Ishii, T. Oguchi. First-principles of exploration of ferromagnetic and ferroelectric double-perovskite transition-metal oxides, Physica B 383 (2006), 9-12.*

S. Vasudevan, C. N. R. Rao, A. M. Umerji, G. V. Subba Rao, Studies on BiCoO3 and BiCo1—xFexO3, Mat. Res. Bull. 14 (1979), 451-454.*

M. Popa, D. Crespo, J.M. Calderon-Moreno. Synthesis and Structural Characterization of Single-Phase BiFeO3 Powders from a Polymeric Precursor, 2007, J. Am. Ceram. Soc., 90(9), 2723-2727.*

H.-X. Lu, X.-Y. Mao, W. Wang, X.-B. Chen. Structural and Multiferroic Properties of BiFe0:5Co0:5O3 Ceramics, 2008, Prog. Electromagn. Res. Sypm., 1093-1096.*

J. Wang, et al., "Epitaxial $BiFeO_3$ Multiferroic Thin Film Heterostructures", Science, vol. 299, Mar. 14, 2003, pp. 1719-1722.

Roth, R.S., et al., Ed., "Phase Diagrams for Ceramists vol. IV", The American Ceramic Society, Inc., 1981, pp. v, vi, 1, 212, and 213.

* cited by examiner

PIEZOELECTRIC BODY AND LIQUID DISCHARGE HEAD

BACKGROUND OF THE INVENTION

1. Field of the Invention

The present invention relates to a piezoelectric body and a liquid discharge head.

2. Description of the Related Art

A research has been conducted in which a ferroelectric material or dielectric material is formed into a thin film to be used as a piezoelectric body for MEMS (Micro ElectroMechanical Systems) or the like. In particular, a research has been actively conducted in which an $ABO_3$ perovskite type oxide is formed into a film to be made into a piezoelectric body, wherein an attempt to enhance a property of the element through the control of the crystalline orientation of the perovskite oxide has been made.

For example, Japanese Patent Application Laid-Open No. H06-350154 discloses a piezoelectric body having a rhombohedral or tetragonal PZT film made of lead zirconate titanium (sometimes referred to as PZT) having a composition within a composition range that is normally tetragonal in a bulk. The piezoelectric body described above is characterized in that the <111> orientation in the case of the rhombohedral PZT film and the <001> orientation in the case of the tetragonal PZT film are 70% or higher with respect to the direction vertical to the major surface of the substrate. However, since these materials include Pb as an A-site atom, the effect to the environment is a problem.

Therefore, there has been proposed a piezoelectric body using $BiFeO_3$ perovskite oxide (e.g., see Japanese Patent Application Laid-Open No. 2005-39166). The $BiFeO_3$ compound disclosed in Japanese Patent Application Laid-Open No. 2005-39166 is also disclosed in "Science", Mar. 14, 2003, vol. 299, No. 5613, p. 1719, as a material having a large remanent polarization. However, there is no description about a piezoelectric body whose B-site atom is an atom of an element other than Fe.

Considering that $PbTiO_3$ having large remanent polarization is not preferably used as a piezoelectric material, it is considered that a high-performance characteristic could not be provided only by $BiFeO_3$. Actually, the invention of Japanese Patent Application Laid-Open No. 2005-39166 describes that an atom of an element such as Mn, Ru, Co, Ni, V, Nb, Ta, W, Ti, Zr, Hf, etc. is added as a B-site atom. However, since the utilized crystal structure is made only of a tetragonal structure or rhombohedral structure, a displacement characteristic or optical characteristic is not utilized in the area where the piezoelectric characteristic is enhanced.

Further, as for Mn, Ru, Co, and Ni disclosed as a magnetic metal element added to $BiFeO_3$, the effect of enhancing magnetism cannot be expected as the addition effect within the range where the additive exceeds 10% with respect to all B-sites in the crystal structure constituting the piezoelectric film.

SUMMARY OF THE INVENTION

An object of the present invention is to provide a piezoelectric body using a lead-free piezoelectric film, which is excellent in piezoelectric characteristic, and a liquid discharge head having the piezoelectric body.

In order to achieve the foregoing object, the present invention provides a piezoelectric body and having a piezoelectric body and a pair of electrodes being in contact with the piezoelectric body, wherein the piezoelectric body consists of an $ABO_3$ perovskite oxide in which an A-site atom consists of Bi and a B-site atom is composed of atoms of at least two types of elements.

Further, the present invention provides a piezoelectric body and having a piezoelectric body and a pair of electrodes being in contact with the piezoelectric body, wherein the piezoelectric body is made of an $ABO_3$ perovskite oxide in which an A-site atom consists of Bi and a B-site atom is composed of Co and Fe, wherein the ratio of the number of atoms of Co to the number of atoms of Fe constituting the B-site of the $ABO_3$ perovskite oxide (Co/Fe) is 15/85 to 35/65.

According to the present invention, a piezoelectric body excellent in piezoelectric characteristic and a liquid discharge head using the same and having large discharge force can be obtained.

Further features of the present invention will become apparent from the following description of exemplary embodiments with reference to the attached drawings.

DESCRIPTION OF THE EMBODIMENTS

A piezoelectric body according to the present invention is provided on a substrate and has a piezoelectric film and a pair of electrodes being in contact with the piezoelectric film. The piezoelectric film is made of $ABO_3$ perovskite oxide in which A-site atom is composed of Bi and a B-site atom is composed of atoms of at least two elements. The piezoelectric film has at least two crystal phases selected from the group consisting of tetragonal, rhombohedral, pseudo-cubic, orthorhombic, and monoclinic structures.

Further, a piezoelectric body according to the present invention is provided on a substrate and has a piezoelectric film and a pair of electrodes being in contact with the piezoelectric film. The piezoelectric film is made of an $ABO_3$ perovskite oxide in which an A-site atom is composed of Bi and a B-site atom is composed of Co and Fe. The ratio of the number of atoms of Co to the number of atoms of Fe constituting the B-site of the $ABO_3$ perovskite oxide (Co/Fe) is 15/85 to 35/65. This composition range is preferable, since the piezoelectric characteristic is further enhanced in this range.

A liquid discharge head according to the present invention is characterized in having the piezoelectric body of the present invention.

An embodiment of the present invention will be explained with reference to drawings.

Figure 1:
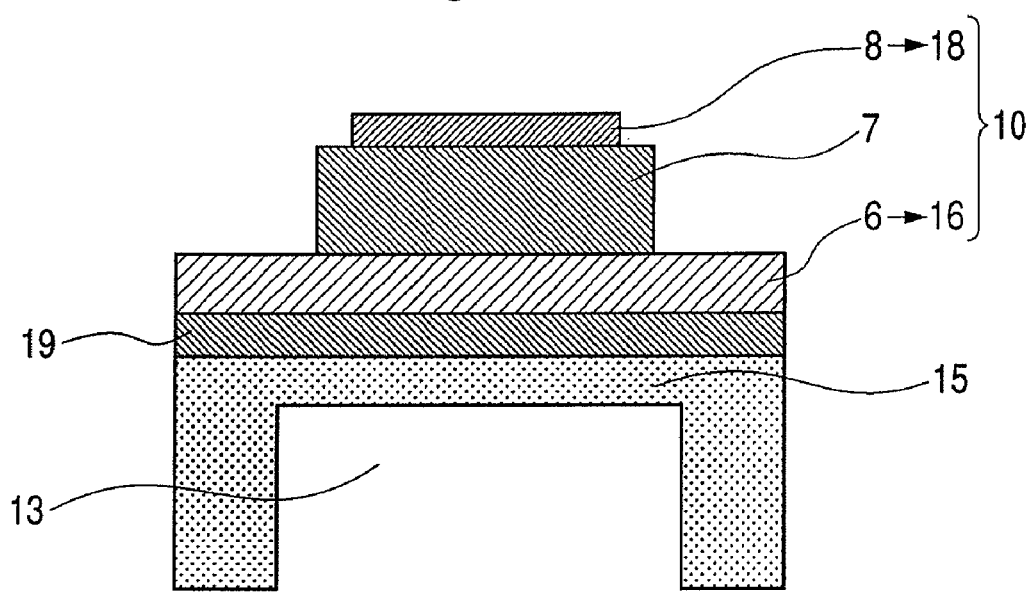
FIG. 1 is a sectional schematic view of a liquid discharge head according to one embodiment of the present invention in a widthwise direction of a piezoelectric body section.
Figure 2:
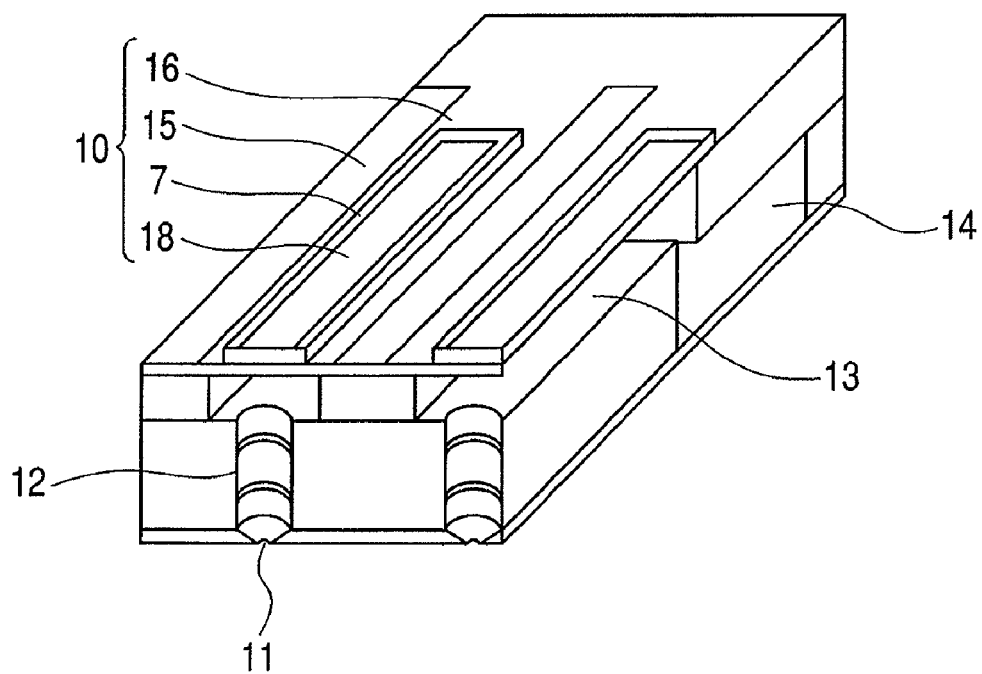
FIG. 2 is a schematic view showing one embodiment of the liquid discharge head according to the present invention.

FIG. 1 is a sectional schematic view of a liquid discharge head according to one embodiment of the present invention in a widthwise direction of a piezoelectric body section. FIG. 2 is a schematic view showing one embodiment of the liquid discharge head according to the present invention.

A piezoelectric body 10 according to one embodiment of the present invention has at least a first electrode 6, a piezoelectric film 7, and a second electrode 8 on a substrate 15 as shown in FIG. 1. The piezoelectric body 10 may have a buffer layer 19 formed on the substrate 15. The piezoelectric film 7 is patterned according to need as shown in FIG. 2.

The piezoelectric body 10 according to the present invention is characterized in that the piezoelectric film 7 is an $ABO_3$ perovskite oxide in which an A-site atom is composed of Bi and a B-site atom is composed of atoms of at least two elements. In the present invention, the A-site is composed of Bi of trivalent ion, and in the $ABO_3$ perovskite oxide, the B-site ion is also trivalent.

Preferable examples of the $ABO_3$ perovskite oxide include one having at least $BiCoO_3$ as a constituent, wherein the B-site atom other than Co of the $ABO_3$ perovskite oxide is an atom of at least one of the elements described below. Specifically, the B-site atom other than Co of the $ABO_3$ perovskite oxide is an atom of at least one of the elements selected from Sc, Al, Mn, Cr, Cu, Ga, In, Yb, Mg, Zn, Zr, Sn, Ti, Nb, Ta, and W. Preferable examples of the $ABO_3$ perovskite oxide include one having at least $BiInO_3$ as a constituent, wherein the B-site atom other than In of the $ABO_3$ perovskite oxide is an atom of at least one of the elements described below. Specifically, the B-site atom other than In of the $ABO_3$ perovskite oxide is an atom of at least one of the elements selected from Sc, Al, Mn, Fe, Cr, Cu, Ga, Yb, Mg, Zn, Zr, Sn, Ti, Nb, Ta, and W.

Specifically, the following can be exemplified as the $ABO_3$ perovskite oxide in which the A-site is made of Bi, and which is the constituent of the $ABO_3$ perovskite oxide in which the A-site consists of Bi and the B-site atom is composed of atoms of at least two elements. Examples of the (a)$BiM^{3+}O_3$ perovskite oxide include $BiCoO_3$, $BiInO_3$, $BiScO_3$, $BiAlO_3$, $BiMnO_3$, $BiFeO_3$, $BiCrO_3$, $BiCuO_3$, $BiGaO_3$, $BiYbO_3$, or the like.

As described above, the B-site atom M of the perovskite oxide that is based upon the $ABO_3$ perovskite oxide $BiMO_3$ in which the A-site atom consists of Bi is trivalent, so that the ionic neutrality can be maintained, whereby the $ABO_3$ perovskite oxide can be provided. However, in addition to this, the combination in which the bivalence and tetravalence are equal as the B-site atom can be employed as the structure capable of maintaining the ionic neutrality, whereby the $ABO_3$ perovskite oxide can be provided.

Specifically, in the perovskite oxide based upon the $ABO_3$ perovskite oxide $BiMO_3$ in which the A-site atom is composed of Bi, if the atom M constituting the B-site is an atom M' that can be bivalence and an atom M" that can be tetravalence, the $ABO_3$ perovskite oxide can be provided in the structure expressed by $Bi(M'_{1/2}{}^{+2}, M''_{1/2}{}^{+4})O_3$.

Examples of the structure in which the B-site atom is constituted by bivalence and tetravalence include $Bi(Mg_{1/2}, Ti_{1/2})O_3$, $Bi(Mg_{1/2}, Zr_{1/2})O_3$, $Bi(Mg_{1/2}, Sn_{1/2})O_3$, $Bi(Zn_{1/2}, Ti_{1/2})O_3$, $Bi(Zn_{1/2}, Zr_{1/2})O_3$, $Bi(Co_{1/2}, Ti_{1/2})O_3$, $Bi(Co_{1/2}, Sn_{1/2})O_3$, $Bi(Mg_{1/4}, Zn_{1/4}, Ti_{1/2})O_3$, $Bi(Mg_{1/4}, Zn_{1/4}, Zr_{1/2})O_3$, or the like, as (b)$Bi(M'_{1/2}{}^{+2}, M''_{1/2}{}^{+4})O_3$-based perovskite oxide.

When the atom that can be bivalence is M', and the atom that can be pentavalence is M" are employed as the combination of bivalence and pentavalence, examples of this structure include $Bi(Mg_{2/3}, Nb_{1/3})O_3$, $Bi(Mg_{2/3}, Ta_{1/3})O_3$, $Bi(Zn_{2/3}, Nb_{1/3})O_3$, $Bi(Zn_{2/3}, Ta_{1/3})O_3$, $Bi(Co_{2/3}, Ta_{1/3})O_3$, $Bi(Co_{2/3}, Nb_{1/3})O_3$, $Bi(Mg_{1/3}, Zn_{1/3}, Nb_{1/3})O_3$, $Bi(Mg_{1/3}, Co_{1/3}, Nb_{1/3})O_3$, $Bi(Mg_{2/3}, Nb_{1/6}, Ta_{1/6})O_3$, or the like, as (c)$Bi(M'_{2/3}{}^{+2}, M''_{1/3}{}^{+5})O_3$-based perovskite oxide.

Similarly, when the atom that can be bivalence is M', and the atom that can be hexavalence is M" are employed as the combination of bivalence and hexavalence, examples of this structure include $Bi(Mg_{3/4}, W_{1/4})O_3$, $Bi(Co_{3/4}, W_{1/4})O_3$, $Bi(Mg_{3/8}, Co_{3/8}, W_{1/4})O_3$, or the like as (d)$Bi(M'_{3/4}{}^{+2}, M''_{1/4}{}^{+6})O_3$-based perovskite oxide.

The $ABO_3$ perovskite oxide exemplified in (b) to (d) in which the A-site atom is composed of Bi can be a piezoelectric film having at least two crystal phases mixedly present according to the present invention, depending upon the ratio of the constituent of the B-site atom.

Alternatively, there is a ratio of the constituent of the B-site atom that is a single phase in the constituent of the material exemplified in (b) to (d), and in this case, including the illustrated case of (a), the $ABO_3$ perovskite oxide illustrated in (a) to (d) in which the A-site atom is composed of Bi is combined to provide the piezoelectric film having at least two crystal phases mixedly present according to the present invention. Specific examples include $BiAlO_3$—$BiFeO_3$, $BiAlO_3$—$BiGaO_3$, $BiCoO_3$—$BiAlO_3$, $BiCoO_3$—$BiCrO_3$, $BiCoO_3$—$BiInO_3$, $BiCoO_3$—$BiMnO_3$, $BiCoO_3$—$Bi(Mg_{1/2}, Ti_{1/2})O_3$, $BiCoO_3$—$Bi(Mg_{2/3}, Nb_{1/3})O_3$, $BiCoO_3$—$Bi(Co_{2/3}, Nb_{1/3})O_3$, $BiInO_3$—$BiAlO_3$, $BiInO_3$—$BiFeO_3$, or the like.

As described above, the piezoelectric film according to the present invention is characterized in having at least two crystal phases selected from the group consisting of tetragonal, rhombohedral, pseudo-cubic, orthorhombic, and monoclinic structures.

In other words, the piezoelectric film according to the present invention comprises the $ABO_3$ perovskite oxide having a composition of morphotropic phase boundary region (sometimes referred to as MPB region), wherein the crystal phases are mixedly present. When the $ABO_3$ perovskite oxide having at least two crystal phases mixedly present and having the composition of the MPB region is employed for the piezoelectric film of the present invention, the difference between the maximum polarizability and the remanent polarization value increases, and further, the dielectric constant is increased to enhance piezoelectric characteristic.

In the MBP region, the piezoelectric film according to the present invention can be made to have mixedly therein at least two crystal phases selected from the group consisting of tetragonal, rhombohedral, pseudo-cubic, orthorhombic, and monoclinic structures.

Figure 3:
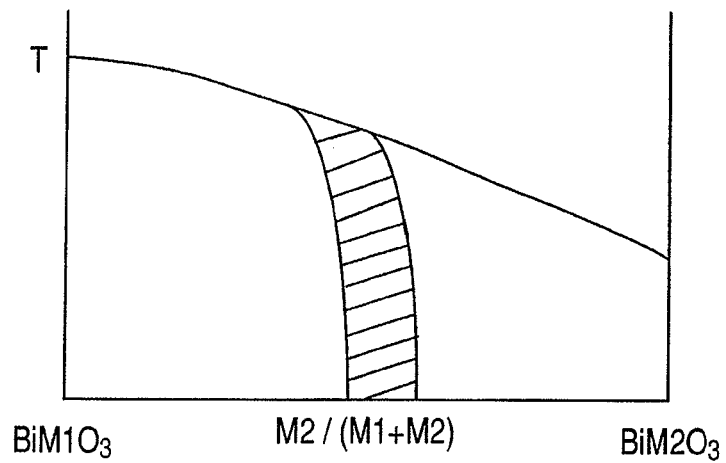
FIG. 3 is a schematic phase diagram showing one example of $BaM1O_3/BaM2O_3$ piezoelectric material in the present invention.

FIG. 3 is a schematic phase diagram showing one example of a binary system piezoelectric material constituted by an $ABO_3$ perovskite oxide $BiM1O_3$ in which the A-site atom is composed of Bi and the B-site atom is M1 and an $ABO_3$ perovskite oxide $BiM2O_3$ in which the B-site atom is M2. The phase diagram shown in FIG. 3 is manufactured by a thin-film forming method such as a sol-gel method, sputtering method, and the like.

In FIG. 3, the axis of abscissa represents the ratio M2/(M1+M2) of the number of atoms M1 and M2 of the B-site atom and the axis of ordinate represents a temperature T. The hatched portion in FIG. 3 is the MPB region where plural crystal phases are mixedly present. The composition range of the MPB region where plural crystal phases are mixedly present changes depending upon the type of the constituent, manufacturing method of the piezoelectric film, the type of the used substrate, and the like. Therefore, the composition range of the MPB region is not determined only by the type of the constituent, and the composition range is increased or decreased even in the same composition.

In the composition region where there is more $BiM1O_3$ than the MPB region, the crystal phase becomes tetragonal, rhombohedral, pseudo-cubic, orthorhombic, etc. depending upon which one is selected as the $ABO_3$ perovskite oxide represented by $BiM1O_3$. For example, when $BiCoO_3$ is selected as the $ABO_3$ perovskite oxide represented by $BiM1O_3$, the crystal phase becomes tetragonal. On the other hand, in the composition region where there is more $BiM2O_3$ than the MPB region, the crystal phase becomes rhombohedral, pseudo-cubic, orthorhombic, etc. depending upon which one is selected as the constituent.

The monoclinic structure may appear in the MPB region, so that the crystal structure in the piezoelectric film according to the present invention may include monoclinic structure.

The structure of the crystal phase of the piezoelectric film according to the present invention can be measured by an X-ray diffractometry or Raman spectroscopy. With these methods, whether one type of crystal is present in the piezoelectric film or two or more crystals are mixedly present in the piezoelectric film can be measured. The orientation of the crystal phase present in the piezoelectric film can be measured by the X-ray diffractometry. Further, the composition of the piezoelectric film can be analyzed by an X-ray fluorescence spectroscopy (XRF) or inductively coupled plasma mass spectroscopy (ICP mass spectroscopy).

It is preferable that the crystal phases in the piezoelectric film according to the present invention are mixedly present in such a manner that the ratio of the crystal phases gradually changes in the thickness direction. More specifically, it is preferable that the ratio of the tetragonal structure is large on one surface and the ratio of the tetragonal structure is less on the other surface in the piezoelectric film according to the present invention. Further, it is more preferable that the ratio of the tetragonal structure is large on the surface at the side of the substrate and the ratio of the tetragonal structure is less on the surface at the other side. Especially, the piezoelectric film in which the ratio of the tetragonal structure is large at the side of the substrate is more preferable. This is because this structure further enhances adhesiveness to the lower electrode, while ensuring satisfactory piezoelectric characteristic. The piezoelectric film described above can be fabricated by using a thin-film forming method by which a film can be formed with an epitaxial growth, such as a sputtering method, affected by the lattice of the substrate.

The piezoelectric film of the present invention is preferably a single orientation film. When the piezoelectric film is formed into a single orientation film, the axis of the polarization agrees with each other for every crystal phases mixedly present, whereby the direction for effectively applying an electric field can be specified.

Figure 5A:
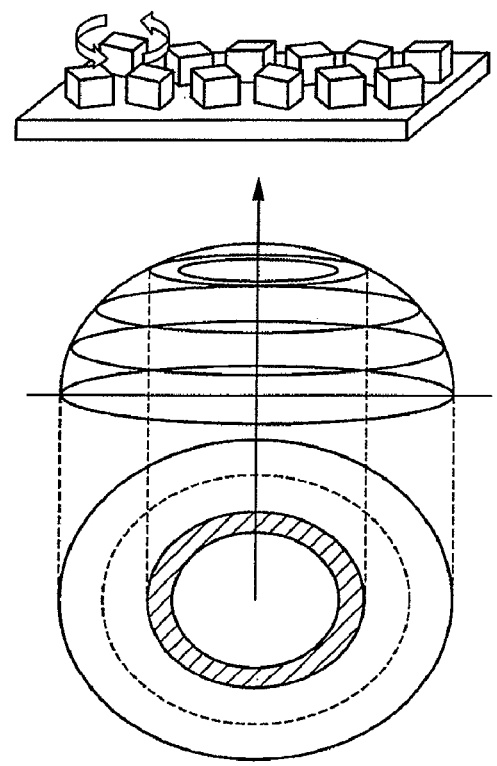
FIG. 5A is a conceptual view of a single orientation film.

The single orientation means a crystal having a single crystal orientation in the film thickness direction. The in-plane orientation of the crystal does not particularly matter. For example, the <100> single orientation is a film in which the film thickness direction is made of the crystal having only <100> orientation. Whether the piezoelectric film has a single orientation or not can be confirmed by using the X-ray diffractometry. In the case of <100> single orientation in the PZT perovskite structure, for example, only the peak on (L00) surface (L=1, 2, 3, ... n: n is an integer) such as {100}, {200}, or the like is detected as the peak caused by the piezoelectric film in 2θ/θ measurement of the X-ray diffractometry. When the polarization on the {110} asymmetric surface is measured, an annular pattern is obtained at the same radius position that indicates the slope of about 45° C. from the center as shown in FIG. 5A.

Figure 5B:
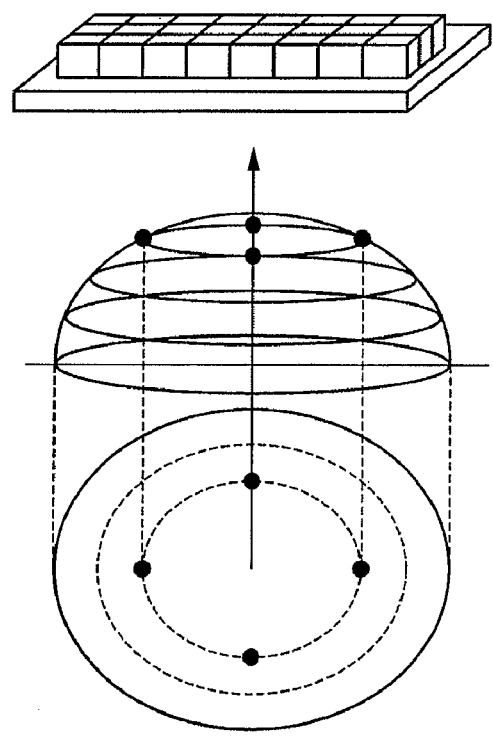
FIG. 5B is a conceptual view of a single crystal film.

The piezoelectric film according to the present invention is also preferably a single crystal film oriented in the plane. The single crystal film oriented also in the plane means a film of a crystal having a single crystal orientation in the film thickness direction and the film in-plane direction. For example, <100> single crystal film is a film composed of a crystal having only <100> orientation in the film thickness direction and <110> orientation in one direction of the film in-plane direction. Whether the piezoelectric film has a single orientation or not can be confirmed by using the X-ray diffractometry. In the case of <100> single crystal film in the PZT perovskite structure, for example, only the peak on (L00) surface (L=1, 2, 3, ... n: n is an integer) such as {100}, {200}, or the like is detected as the peak caused by the piezoelectric film in 2θ/θ measurement of the X-ray diffractometry. When the polarization on the {110} asymmetric surface is measured, symmetric spot-like pattern is obtained four times at every 90° C. at the same radius position that indicates the slope of about 45° C. from the center as shown in FIG. 5B.

Further, there is a crystal in which symmetric pattern is obtained eight times or twelve times at the same radius position that indicates the slope of about 45° C. from the center when the polarization on the {110} asymmetric surface is measured in the PZT perovskite structure having <100> orientation. Alternatively, there is a crystal in which the pattern is not a spot but an ellipse. Since the crystals described above are crystals having medium symmetry of the single crystal film and the single orientation film according to the present invention, they are broadly regarded as the single crystal film and the single orientation film. Similarly, the state of the MPB region where monoclinic phase and tetragonal phase, monoclinic phase and rhombohedral phase, tetragonal phase and rhombohedral phase, and all phases are mixedly present, the case where the crystals resulting from a twin are mixedly present, and the case where there are a dislocation and defect, are broadly regarded as a single crystal film and single orientation film. The crystal having plural crystal phases mixedly (mixed phases) described here means that plural crystal phases are present in a particle of one perovskite oxide, i.e., plural crystal phases integrally form a single crystal or single orientation, but not that plural crystal phases are contained with a grain boundary in a polycrystalline state with each crystal orientation being different from each other.

It is preferable that the crystal orientation of the piezoelectric film according to the present invention is <100> single orientation or the piezoelectric film according to the present invention is a <100> single crystal film.

Particularly, the piezoelectric film according to the present invention preferably has a <100> orientation, and the crystal phases mixedly present in the piezoelectric film of the present invention are preferably a tetragonal phase and at least one selected from the group consisting of rhombohedral, pseudo-cubic, orthorhombic, and monoclinic phases. In the piezoelectric film described above, the direction of the polarization axis can agree with each other in the film thickness direction of the piezoelectric film in the case of the (001) or (010) orientation, and further, in a case where there is (100) orientation, the orientation change is possible to the (001) orientation or (010) orientation due to the application of an electric field, whereby enhanced piezoelectric performance, particularly displacement performance can be obtained. The piezoelectric film described above can be formed, for example, by appropriately selecting the film-forming temperature or film-formed substrate during the film formation of the piezoelectric film. At least two crystal phases mixedly present are preferably tetragonal and pseudo-cubic phases, or tetragonal and rhombohedral phases. In the piezoelectric film described above, the pseudo-cubic or rhombohedral phase mixedly present with the tetragonal phase is brought into a state where the phase cab be easily changed to the tetragonal phase by applying an electric field, whereby enhanced piezoelectric characteristic can be obtained.

The $ABO_3$ perovskite oxide, having the region where the phases are mixedly present, in which the A-site atom is composed of Bi and B-site atom is constituted by atoms of at least two types of elements, is difficult to be manufactured or has not yet been manufactured in a general bulk-type piezoelectric member manufacturing method in which ceramic or bulk-type crystal growth is employed.

In view of this, the piezoelectric film according to the present invention is formed on the substrate.

Preferable film forming methods include thin-film forming method such as a sol-gel method, sputtering method, metal organic chemical vapor deposition method (sometimes referred to as MO-CVD method), etc.

In order to crystallize the piezoelectric film formed on the substrate, the piezoelectric film and the substrate are heated after the piezoelectric film is formed on the substrate or during the formation of the piezoelectric film.

When there is a difference in the thermal expansion coefficient between the substrate and the piezoelectric film during the process of applying heat after the piezoelectric film is formed or during the formation of the piezoelectric film and bringing the temperature of the piezoelectric film and the substrate to room temperature, stress is produced between the substrate and the piezoelectric film.

When contraction or tensile stress is applied from the substrate to the piezoelectric film formed on the substrate during the temperature lowering process, the piezoelectric film changes its crystal structure into a stable state so as to relieve the stress.

Since the piezoelectric film formed on the substrate has the stress relieving process, the state where at least two phases are mixedly present, which cannot be manufactured by a general bulk-type piezoelectric member manufacturing method in which ceramic or bulk-type crystal growth is employed, is considered to be created.

Finally, the absolute value of the contraction or tensile stress (sometimes referred to as residual stress) applied to the piezoelectric film of the present invention from the substrate at room temperature or use temperature of the piezoelectric film is preferably small from the viewpoint of the piezoelectric performance of the piezoelectric film.

Specifically, the absolute value of the residual stress is preferably 300 Mpa or lower, more preferably 150 Mpa or lower. The residual stress can be calculated from the warp of the substrate on which the piezoelectric film is formed.

When the material of the substrate and piezoelectric film, temperature lowering condition, etc. is selected from the viewpoint of providing the piezoelectric film having the mixed phase, the residual stress might be present on the piezoelectric film of the present invention at room temperature or use temperature of the piezoelectric film.

In this case, the effect of the present invention can be obtained, although the absolute value of the residual stress on the piezoelectric film at room temperature or use temperature of the piezoelectric film of the present invention preferably exceeds 0 Pa, and is preferably substantially 0.1 Mpa or higher for obtaining the effect of the present invention.

The piezoelectric film according to the present invention preferably has a thickness of 1.0 μm or larger and 15 μm or smaller, more preferably has a thickness of 1.5 μm or larger and 10 μm or smaller. When the thickness become 1.0 μm or larger, a liquid discharge head having large discharging force can be obtained, if the piezoelectric body according to the present invention having the piezoelectric film is used for a liquid discharge head of the present invention. Further, the thickness 15 μm or smaller is suitable for microfabrication in MEMS application. Therefore, when the thickness of the piezoelectric film in the present invention is 1.0 μm or larger and 15 μm or smaller, the piezoelectric body suitable for a liquid discharge head can be obtained.

The piezoelectric body according to the present invention can be manufactured by forming at least the first electrode 6 on the substrate 15, forming the piezoelectric film 7 thereon, and the second electrode 8 thereon. As shown in FIG. 1, the buffer layer 19 may be formed on the substrate 15, and the first electrode 6 may be formed thereon.

In a case where the piezoelectric film 7 is formed to have a single crystal, a single crystal substrate is preferably used for the substrate 15 used in the present invention. Preferable single crystal substrates that can be used in the present invention include Si substrate, SOI substrate, $SrTiO_3$ substrate, MgO substrate, etc. Among these substrates, Si substrate or SOI substrate is more preferable. When the piezoelectric film 7 is formed to have a single orientation film, preferable examples of the substrate include Si substrate, SOI substrate, SUS substrate, metal substrate, ceramic substrate, etc. Si substrate or SOI substrate is more preferable.

In order to obtain an epitaxial piezoelectric film, it is preferable that the piezoelectric film is formed through an epitaxial <100> oxide electrode formed on the Si substrate or SOI substrate, such as yttria-stabilized zirconia (YSZ), $SrTiO_3$, MgO, etc. In order to form the piezoelectric film into a single orientation film, it is preferable that the piezoelectric film is formed through <100> oxide electrode of face-centered cubic metal formed on the Si substrate or SOI substrate. According to the preferable film forming method for obtaining the above-mentioned single-oriented piezoelectric film, the order of the layer structure on the Si substrate is oxide electrode/face-centered cubic metal/$TiO_2$/$SiO_2$/Si, oxide electrode/face-centered cubic metal/Ta/$SiO_2$/Si. Here, /$TiO_2$/, /Ta/ are bonded layers. The oxide electrode may have laminate structure having two or more layers.

The first electrode 6 and the second electrode 8 in the piezoelectric body according to the present invention may be upper and lower electrodes sandwiching the piezoelectric film 7 as shown in FIG. 1, or combshaped electrode provided on the same surface of the piezoelectric film 7. In the case of the piezoelectric body utilizing a bending mode in which a vibration plate is deformed to obtain a displacement amount, the configuration of the upper and lower electrodes sandwiching the piezoelectric film can provide the displacement amount with lower voltage.

When the electrodes are provided above and below the piezoelectric film, the first electrode is provided on the substrate. A buffer layer for controlling orientation may be interposed between the first electrode and the substrate. A YSZ film, $SrTiO_3$ film, MgO film, etc. is preferably used as the buffer layer.

It is preferable that the first electrode 6 and the second electrode 8 in the present invention are made of a metal material such as a metal having a face-centered cubic structure, a metal having a hexagonal closest packing structure, a metal having a body-centered cubic structure, or the like, or a conductive material such as $ABO_3$ perovskite oxide or the like.

Preferable examples of the metal having a face-centered cubic structure include Pt, Ir, Au, Ni, Cu, etc. Preferable examples of the metal having a hexagonal closest packing structure include Ru, Ti, Os, etc. Preferable examples of the metal having a body-centered cubic structure include Cr, Fe, W, Ta, etc. A part of the metal materials described above may be an oxide to such a degree that crystallinity and conductivity are not deteriorated.

Preferable examples of the $ABO_3$ perovskite oxide include $SrRuO_3$, $(La, Sr)CoO_3$, $BaPbO_3$, $(La, Sr)TiO_3$, $LaNiO_3$, etc.

Plural types of the aforesaid electrode materials may be used together. In this case, the first electrode and the second electrode may be composed of two or more layers.

It is preferable that the thicknesses of the first electrode and the second electrode are generally set to be 50 nm or larger and 500 nm or smaller, more preferably, 100 nm or larger and 400 nm or smaller. The thickness of the first electrode and the thickness of the second electrode are preferably set so as to be 50 nm or larger, since conductivity is enhanced. The thickness of the first electrode and the thickness of the second electrode are preferably set so as to be 500 nm or smaller, since the displacement amount of the piezoelectric body is enhanced, whereby the control of the crystallinity of the electrodes is facilitated.

Figure 4A:
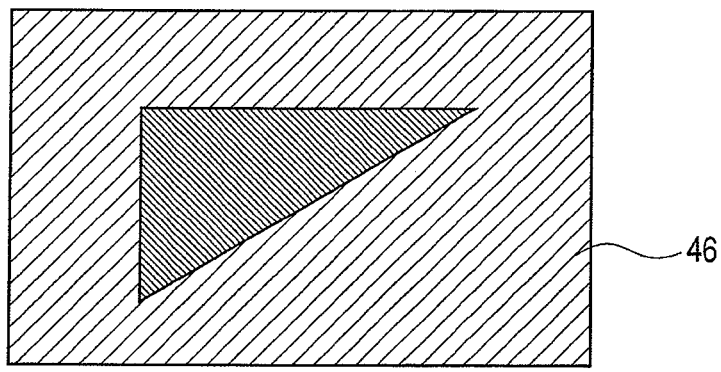
FIG. 4A is a schematic top view of a scrub-type optical waveguide that is an optical piezoelectric body according to one embodiment of the piezoelectric body of the present invention.
Figure 4B:
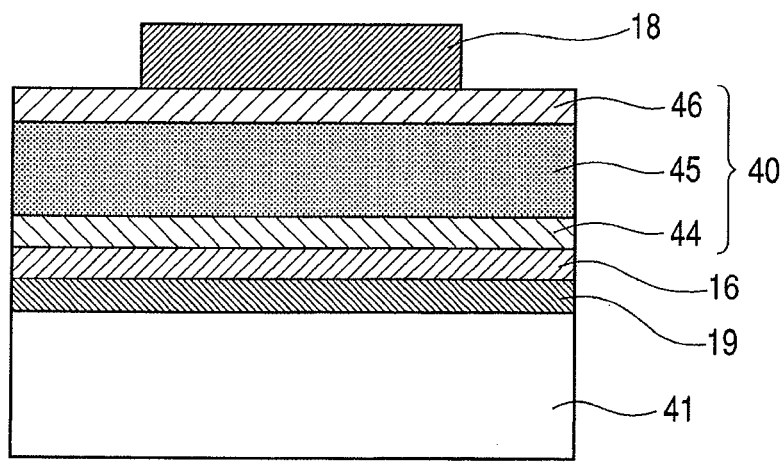
FIG. 4B is a schematic sectional view of a scrub-type optical waveguide that is an optical piezoelectric body according to one embodiment of the piezoelectric body of the present invention.

FIGS. 4A and 4B are schematic diagrams of a scrub-type optical waveguide that is an optical piezoelectric body according to one embodiment of the piezoelectric body of the present invention. FIG. 4A is a schematic diagram viewed from the upper electrode 18 side, while FIG. 4B is a schematic diagram viewed from the cross-sectional direction. The optical waveguide 40 comprises clad layers 44 and 46 and a core layer 45. Numeral 41 denotes a substrate, preferably an Si substrate. Numeral 19 denotes a buffer layer for forming an orientation film or epitaxial film on the Si substrate, and numeral 16 denotes an electrode layer. Numeral 18 denotes an upper electrode, which is a deflecting electrode. The piezoelectric film in the present invention is used as the core layer 45.

The liquid discharge head according to the present invention will be explained with reference to FIG. 2 and FIG. 1.

The liquid discharge head according to the present invention is a liquid discharge head having the piezoelectric body of the present invention. FIG. 2 is a schematic diagram showing one example of the embodiment of the liquid discharge head as described above. The liquid discharge head shown in FIG. 2 has a discharge port 11, a communication hole 12 for communicating the discharge port 11 with an individual liquid chamber 13, and a common liquid chamber 14 for supplying liquid to the individual liquid chamber 13. The liquid is supplied to the discharge port 11 along the communicating path. A part of the individual liquid chamber 13 is made of a vibrating plate 15. The piezoelectric body 10 for applying vibration to the vibrating plate 15 is provided at the outside of the individual liquid chamber. When voltage is applied to the piezoelectric body 10 from an unillustrated power supply in order to drive the piezoelectric body 10, the vibration is applied to the vibration plate 15 from the piezoelectric body 10, so that the liquid in the individual liquid chamber 13 is discharged from the discharge port 11.

The piezoelectric body 10 has the piezoelectric film 7 that is patterned in a rectangular shape as shown in FIG. 2. The shape may be ellipse, circle, parallelogram, etc., instead of a rectangle. In this case, the piezoelectric film 7 generally takes a shape along the shape of the individual liquid chamber 13 in the liquid discharge head.

The piezoelectric body 10 constituting the liquid discharge head according to the present invention will further be explained in detail with reference to FIG. 1.

Although the sectional shape of the piezoelectric film 7 of the piezoelectric body 10 in the embodiment shown in FIG. 1 is represented as a rectangle, it may be represented by a trapezoid or reverse trapezoid. The first electrode 6 and the second electrode 8 constituting the piezoelectric body 10 of the present invention may be the lower electrode 16 and the upper electrode 18 of the liquid discharge head or vice versa.

Similarly, the vibrating plate 15 may be composed of a part of the substrate 15 constituting the piezoelectric body 10 of the present invention. The difference in the configuration depends upon the manufacturing method for forming the device, and both configurations can provide the effect of the present invention.

The buffer layer 19 may be interposed between the vibrating plate 15 and the lower electrode film 16. The thickness of the buffer layer is generally 5 nm or larger and 300 nm or smaller, more preferably 10 nm or larger and 200 nm or smaller.

In the liquid discharge head, the vibrating plate vibrates vertically by the expansion and contraction of the piezoelectric film, whereby pressure is applied to the liquid in the individual liquid chamber so as to discharge the liquid from the discharge port.

The thickness of the vibrating plate is generally 1.0 μm or larger and 15 μm or smaller, more preferably 1.5 μm or larger and 8 μm or smaller. The vibrating plate may be made of a part of the substrate. In this case, the material of the vibrating plate is preferably Si as explained above. The buffer layer or electrode formed on the substrate may be a part of the vibrating plate. B may be doped into Si of the vibrating plate.

The size of the discharge port is preferably 5 μmφ or larger and 40 μmφ or smaller in general. Although the shape of the discharge port is generally a circle, it may be a star, rectangle, triangle, etc.

The liquid discharge head according to the present invention can be used not only for a printer but also for manufacturing an electronic device.

The embodiment of the present invention will be explained next in further detail with reference to examples.

EXAMPLE 1

A film-forming substrate having yttria stabilized zirconium (YSZ), $CeO_2$, and $LaNiO_3$ successively laminated on an Si(100) substrate having a thickness of 500 μm was prepared, and $SrRuO_3$ was formed to have a thickness of 200 nm as an electrode layer by a sputtering method.

Subsequently, $Bi(Co, Cr)O_3$ was formed to have a thickness of 2 μm by a pulse-MO-CVD method by using a gaseous mixture of $Bi(CH_3)_2(2-(CH_3)_2NCH_2C_6H_5)$, $Co(CH_3C_5H_4)_2$, $Cr(CH_3C_5H_4)_3$ with the temperature of the prepared substrate set to 650° C. When the formed $Bi(Co, Cr)O_3$ was subject to X-ray diffraction, it was confirmed that the obtained one was a single crystal film and had a mixed phase of tetragonal/rhombohedral. It had a film structure in which the crystal phase was inclined and the tetragonal structure was present at the side of the substrate in an amount of 70 vol. % and the rhombohedral structure was present at the side of the surface of the piezoelectric film in an amount of 50 vol. %

Next, a Pt electrode having 100 μmφ was formed to have a thickness of 100 nm on the formed piezoelectric member to manufacture a piezoelectric body, and $d_{33}$ measurement was performed for the evaluation of the piezoelectricity. The result is shown in Table 1.

The $d_{33}$ measurement was carried out by using in combination a scanning probe microscope (SPM), which is a general method for measuring a strain induced by an electric field on a thin-film piezoelectric member, and a ferroelectric tester. The scanning probe microscope of SPI-3800 (trade name, manufactured by Seiko Instruments Inc.) and the ferroelectric tester of FCE-1 (trade name, manufactured by Toyo Corporation) were used.

EXAMPLE 2

Bi(Co, Cr)O$_3$ was formed, as the piezoelectric member according to the present invention, to have a thickness of 2 μm by a pulse-MO-CVD method by using a gaseous mixture of Bi(CH$_3$)$_2$ (2-(CH$_3$)$_2$NCH$_2$C$_6$H$_5$), Co(CH$_3$C$_5$H$_4$)$_2$, Fe(CH$_3$C$_5$H$_4$)$_3$ as source gas with the temperature of the prepared substrate set to 650° C. in the same manner as in Example 1. When the component analysis of the formed Bi(Co, Fe)O$_3$ was carried out with an ICP mass spectrometry, the ratio of Co/Fe of the number of atoms of Co and Fe was 15/85.

Next, in the same manner as in Example 1, a Pt electrode was formed to manufacture a piezoelectric member, and d$_{33}$ measurement was performed. The result is shown in Table 1.

EXAMPLES 3 AND 4

The mixture ratio of the source gas similar to that in Example 2 was changed to manufacture two types of piezoelectric members of Bi(Co, Fe)O$_3$ according to the present invention, each having the different ratio of the number of atoms. When the component analysis of the formed Bi(Co, Fe)O$_3$ was carried out with an ICP mass spectrometry, the ratios of Co/Fe of the number of atoms of Co and Fe were 25/75 and 35/65 respectively.

Then, a Pt electrode was formed, in the same manner as in Example 1, to manufacture a piezoelectric member, and d$_{33}$ measurement was carried out. The result is shown in Table 1.

TABLE 1

| | \multicolumn{5}{c}{Characteristic of piezoelectric member according to the present invention} |
|---|---|---|---|---|---|

| | M1 | M2 | M1/M2 | Crystal phase | d33 [pm/V] |
|---|---|---|---|---|---|
| Example 1 | Co | Cr | — | Tetragonal/rhombohedral | 85 |
| Example 2 | Co | Fe | 15/85 | — | 76 |
| Example 3 | Co | Fe | 25/75 | — | 90 |
| Example 4 | Co | Fe | 35/65 | — | 78 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

In the above-described embodiments, the piezoelectric body has a typical shape, namely film shape and is referred to as "piezoelectric film." However, the piezoelectric body is not limited to the film shape and may have a so-called bulk shape.

This application claims the benefit of Japanese Patent Applications No. 2006-250602, filed Sep. 15, 2006 and No. 2007-072401, filed Mar. 20, 2007, which are hereby incorporated by reference herein in their entirety.

What is claimed is:

1. A piezoelectric element comprising:
a piezoelectric body comprising a piezoelectric film and a pair of electrodes in contact with the piezoelectric film, the piezoelectric film being interposed between the pair of electrodes; and
a substrate on which the piezoelectric body is formed,
wherein the piezoelectric film is an ABO$_3$ perovskite oxide in which an A-site atom consists of Bi and a B-site atom is composed of atoms of at least two types of elements, wherein the piezoelectric film includes at least two crystal phases, one of which is a tetragonal structure and another of which is selected from the group consisting of rhombohedral, pseudo-cubic, orthorhombic, and monoclinic structures, and
wherein the ratio of the tetragonal structure is larger on the surface of the piezoelectric film at the side of the substrate than on the surface of the piezoelectric film at the other side.

2. A piezoelectric element according to claim 1, wherein the ABO$_3$ perovskite oxide has BiCoO$_3$ as a constituent, wherein the B-site atom other than Co of the ABO$_3$ perovskite oxide is an atom of at least one element selected from the group consisting of Sc, Al, Mn, Cr, Cu, Ga, In, Yb, Mg, Zn, Zr, Sn, Ti, Nb, Ta and W.

3. A piezoelectric element according to claim 1, wherein the ABO$_3$ perovskite oxide has BiInO$_3$ as a constituent, wherein the B-site atom other than In of the ABO$_3$ perovskite oxide is an atom of at least one element selected from the group consisting of Sc, Al, Mn, Fe, Cr, Cu, Ga, Yb, Mg, Zn, Zr, Sn, Ti, Nb, Ta and W.

4. A piezoelectric element according to claim 1, wherein the piezoelectric film has a thickness of 1 μm or larger and 15 μm or smaller.

5. A piezoelectric element according to claim 1, wherein the ratio of the crystal phases mixedly present gradually changes in the thickness direction.

6. A piezoelectric element according to claim 1, wherein the piezoelectric film is a single orientation film.

7. A piezoelectric element according to claim 6, wherein the piezoelectric film is a single crystal film that is orientated also in the plane.

8. A piezoelectric element according to claim 7, wherein the crystal orientation of the piezoelectric film is <100> single orientation.

9. A piezoelectric element comprising:
a piezoelectric body comprising a piezoelectric film and a pair of electrodes in contact with the piezoelectric film, the piezoelectric film being interposed between the pair of electrodes; and
a substrate on which the piezoelectric body is formed,
wherein the piezoelectric film is an ABO$_3$ perovskite oxide in which an A-site atom consists of Bi and a B-site atom is composed of Co and Fe,
wherein the ratio Co/Fe of the number of atoms of Co and Fe constituting the B-site of the ABO$_3$ perovskite oxide is 15/85 to 35/65,
wherein the piezoelectric film includes at least two crystal phases, one of which is a tetragonal structure and another of which is selected from the group consisting of rhombohedral, pseudo-cubic, orthorhombic, and monoclinic structures, and
wherein the ratio of the tetragonal structure is larger on the surface of the piezoelectric film at the side of the substrate than on the surface of the piezoelectric film at the other side.

10. A liquid discharge head comprising the piezoelectric element according to claim 1, and discharging liquid by the piezoelectric element.

* * * * *